United States Patent [19]

Muro

[11] Patent Number: 4,816,880
[45] Date of Patent: Mar. 28, 1989

[54] JUNCTION FIELD EFFECT TRANSISTOR

[75] Inventor: Hideo Muro, Yokohama, Japan

[73] Assignee: Nissan Motor Co., Ltd., Yokohama, Japan

[21] Appl. No.: 55,314

[22] Filed: May 29, 1987

[30] Foreign Application Priority Data

Jun. 5, 1986 [JP] Japan ............................ 61-84707[U]

[51] Int. Cl.[4] ........................................... H01L 29/80
[52] U.S. Cl. ......................................... 357/22; 357/41
[58] Field of Search ................ 357/22 R, 41; 437/911

[56] References Cited

FOREIGN PATENT DOCUMENTS

| 57-409983 | 3/1982 | Japan | 357/22 |
| 57-211278 | 12/1982 | Japan . | |
| 58-30163 | 2/1983 | Japan | 357/22 |
| 8602203 | 4/1986 | PCT Int'l Appl. | 357/22 |

OTHER PUBLICATIONS

Electronic Components and Applications, vol. 2, #3 May 1980 pp. 165-169.
Electronics Engineers' Handbook, Second Edition, Donald G. Fink, Editor-in-chief, McGraw-Hill Book Company, New York, 1982, pp. 8-28 Through 8-30.

Primary Examiner—Martin H. Edlow
Assistant Examiner—Mark Prenty
Attorney, Agent, or Firm—Foley & Lardner, Schwartz, Jeffery, Schwaab, Mack, Blumenthal & Evans

[57] ABSTRACT

A junction field effect semiconductor device is provided with p-type source and drain semiconductor regions separately formed in an n-type expitaxial layer grown on a substrate, a p-type channel layer, a highly doped n+-type gate region surrounding the source and drain regions and the channel layer, and a highly doped n+-type top gate layer formed on the channel layer. The channel layer is formed only in an area bounded between the source and drain regions, so that it is possible to make a drain current proportional to a channel width to length ratio.

8 Claims, 3 Drawing Sheets

4,816,880

JUNCTION FIELD EFFECT TRANSISTOR

BACKGROUND OF THE INVENTION

The present invention relates to junction field effect transistors (JFETs) having structures suitable for integration in bipolar ICs.

The junction field effect transistors are widely used in input stages of amplifiers because of their low noise performance.

Japanese patent provisional publication No. 57-211278 shows a conventional type junction field effect transistor integrated in a bipolar IC.

As mentioned later with reference to FIGS. 4 and 5, the junction field effect transistor of this conventional example is unsatisfactory in that a drain saturation current Idss is unknown at the time of initial design and layout of an IC.

SUMMARY OF THE INVENTION

It is an object of the present invention to provide a junction field effect semiconductor device whose saturation drain current can be preliminarily determined from a mask pattern.

According to the present invention, a junction field effect semiconductor device comprises a semiconductor substrate, a first semiconductor layer of a first conductivity type, source and drain semiconductor regions of a second conductivity type opposite to the first conductivity type, a channel semiconductor layer of the second conductivity type, a highly doped gate semiconductor region of the first conductivity type, and a highly doped gate semiconductor layer of the first conductivity type.

The first semiconductor layer is formed on the substrate. For example, the first semiconductor layer is an epitaxial layer grown on the substrate. The source and drain regions are formed in the first semiconductor layer. The source and drain regions are separated from each other, and each of the source and drain regions extends from a first end to a second end.

The channel semiconductor layer is formed only in an area bounded by a quadrangle having two opposite sides (straight line segments) one of which joins the first and second ends of the source region, and the other of which joins the first and second ends of the drain region. Accordingly, the channel layer is formed only in an area between the source and drain regions, and the channel layer is not formed outside this area.

The highly doped gate semiconductor region is formed so as to surround the source region, the drain region and the channel layer. The highly doped gate semiconductor layer is formed on the channel layer. The gate layer extends beyond the channel layer and reaches the gate region.

DETAILED DESCRIPTION OF THE INVENTION

Figure 4:
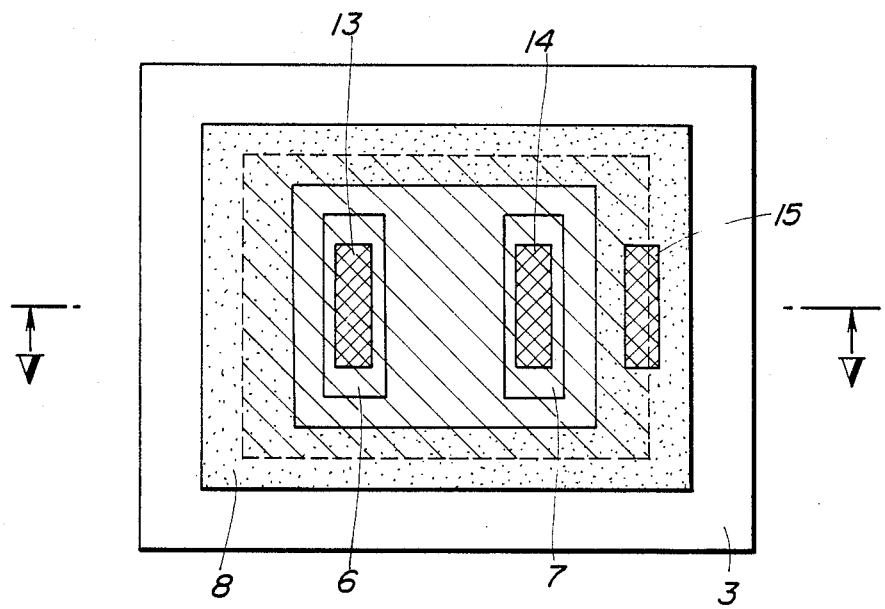
FIG. 4 is a plan view of a conventional type junction field effect semiconductor device.
Figure 5:
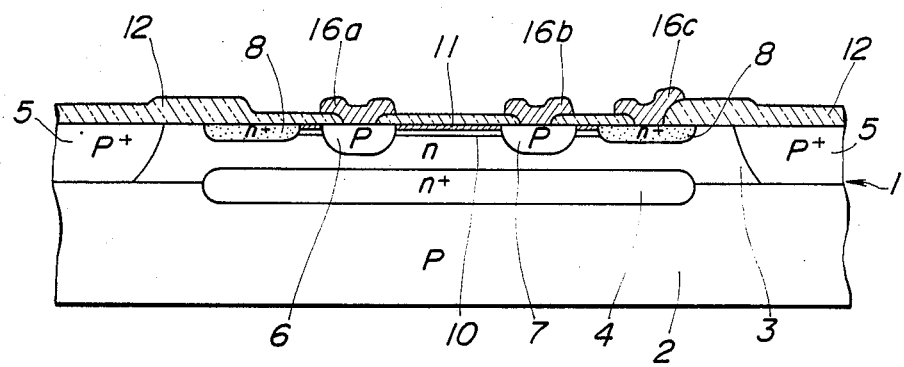
FIG. 5 is a sectional view taken on a line V—V of FIG. 4.

FIGS. 4 and 5 show the above-mentioned conventional type junction field effect transistor (JFET) disclosed in the Japanese patent provisional publication No. 57-211278. This transistor is contained in a bipolar IC.

The semiconductor device shown in FIGS. 4 and 5 has an epitaxial substrate 1 in which an n-type epitaxial layer 3 is formed on a principal surface of a p-type Si substrate 2. The semiconductor device further has an n+-type buried layer 4, and a p+-type isolation diffusion wall 5. The junction field effect transistor of this example is formed in an epitaxial island isolated from other integrated devices such as bipolar devices. The junction field effect transistor has a p-type source region 6, a p-type drain region 7 and an n+-type gate region 8, which are formed in the n-type epitaxial layer 3. The source and drain regions 6 and 7 extend in parallel to each other, and are separated from each other at a predetermined distance. The gate region 8 is formed so as to surround the source region 6 and the drain region 7.

This junction field effect transistor can be fabricated simultaneously with bipolar devices of the bipolar IC. The p-type source and drain regions 6 and 7 can be formed by a p-type base diffusion step, and the n+-type gate region 8 can be formed by an n+-type emitter diffusion.

The junction field effect transistor of FIGS. 4 and 5 further has a p-type channel semiconductor layer 10 extending over the entire area surrounded by the n+-type gate region 8, and an n -type top gate semiconductor layer 11 formed on the channel layer 10. The channel layer 10 is formed by ion implantation of boron (B), and the top gate layer 11 is formed by ion implantion of phosphorus (P).

There are further formed an oxide film 12 of $SiO_2$, source, drain and gate contact windows 13, 14 and 15, respectively, for the source, drain and gate regions 6, 7 and 8, and Al interconnection layers 16a, 16b and 16c, respectively, for the source, drain and gate regions 6, 7 and 8.

When the source region 6 is grounded, and the drain region 7 is connected to a negative terminal of the power supply, then a current flow is made through the channel layer 10. To control this current, a positive control voltage is applied to the gate region 8, and therefore the top gate layer 11 is reverse-biased with respect to the channel layer 10. As a result of this reverse bias, a depletion region extends into the channel layer, and varies the effective thickness of the channel in accordance with the amount of the reverse bias. In this way, the drain current is controlled.

In this case, the control voltage applied to the gate region 8 further acts as a reverse bias between the epitaxial layer 3 and the channel layer 10. Therefore, the control voltage is applied to the channel layer 10 from both of the upper and lower sides, so that the drain current is controlled efficiently.

The junction field effect transistor of this type is advantageous in that this JFET structure is compatible with the bipolar technology, and hence easy to fabricate, and in that the control efficiency is superior, as mentioned before. In general, the value of a saturation drain current Idss of a JFET is important to design and layout of a circuit. Therefore, it is desirable if the value of the saturation drain current Idss can be known preliminarily at the time of initial design and layout of mask patterns.

However, it is difficult to design such a JFET of the above-mentioned conventional type that has a predetermined value of the saturation drain current. In this conventional JFET, the channel layer 10 is formed not only in a central area bounded between the source and drain region 6 and 7, but also in a peripheral area surrounding the source and drain regions 6 and 7, so that the drain current flows not only in the central area but also in the peripheral area. Therefore, it is difficult to determine the value of the saturation drain current preliminarily.

Figure 1:
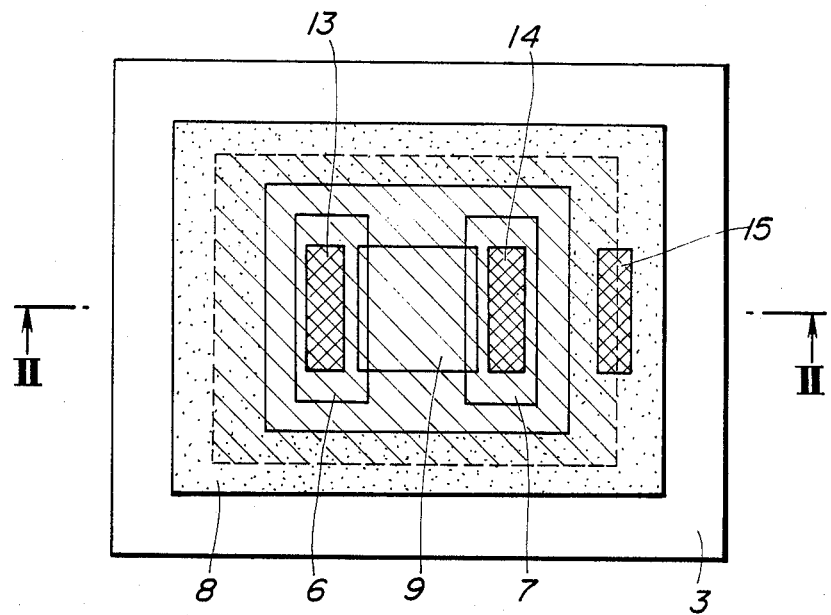
FIG. 1 is a plan view of a junction field effect semiconductor device showing a first embodiment of the present invention.
Figure 2:
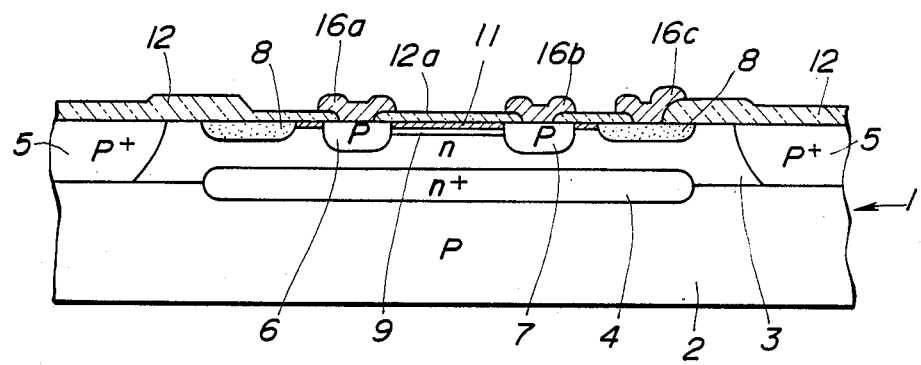
FIG. 2 is a sectional view taken on a line II—II of FIG. 1.

One embodiment of the present invention is shown in FIGS. 1 and 2. A junction field effect semiconductor device of this embodiment is basically identical to the conventional device shown in FIGS. 4 and 5, but different from the conventional one in that a channel layer is formed only in a limited area.

Like conventional devices, the semiconductor device of FIGS. 1 and 2 has an epitaxial substrate 1 consisting of a p-type Si substrate 2 and an n-type epitaxial layer 3 grown on the Si substrate 2, an n+-type buried layer 4, a P+-type isolation diffusion wall 5, a p-type source region 6, a p-type drain region 7, an n+-type gate region 8 surrounding the source and drain regions 6 and 7, a p-type channel layer 10, an n+-type top gate layer 11, an $SiO_2$ film 12, three contact windows 13, 14 and 15, and three Al interconnections 16a, 16b and 16c. The source and drain regions 6 and 7 are formed in the epitaxial layer 3 at a predetermined distance apart from each other. Each of the source and drain regions 6 and 7 of this embodiment is shaped like a stripe.

Unlike the conventional device, the channel layer 9 of the present invention is formed only in an area bounded by a quadrangle (four-sided polygon) having a first side (straight line segment) joining both ends of the source region 6, a second side joining both ends of the drain region 7 and opposing the first side, and third and fourth opposite sides extending between the source and drain regions 6 and 7.

In the embodiment shown in FIG. 1, each of the source and drain stripe regions 6 and 7 of a substantially equal length extends in parallel to the other from a first end to a second end, as shown in FIG. 1, and the channel layer 9 is confined in a rectangle determined by the first and second ends of the source region 6 and the first and second ends of the drain region 7. In this embodiment, the width of the channel layer 9 is shorter than the length of the source and drain regions 6 and 7.

The junction field effect semiconductor device of this embodiment can be fabricated as follows.

The p-type source and drain regions 6 and 7, and the n+-type gate region 8 can be formed by steps for fabricating bipolar transistors, as in the conventional device of FIGS. 4 and 5.

After the source, drain and gate regions 6, 7 and 8 have been formed in an isolation pocket of the epitaxial layer 3, the oxide surface film 12 is removed in an area of the semiconductor surface shown by a broken line rectangle in FIG. 1 by using a photoresist mask. Then, a relatively thin thermal oxidation film 12a is formed in this exposed area. The thickness of the thermal oxidation film 12a is 500–2000 angstroms. Then, a photoresist mask is formed by coating a photoresist on the surface of the oxidation film 12a and removing the portion corresponding to the channel layer 9. Finally, the channel layer 9 is formed by implanting boron ions through the oxidation film 12a by the aid of the photoresist mask. The acceleration energy of the ion implantation is 50–200 keV, and the implanted dopant quantity is $5 \times 10^{11} - 5 \times 10^{12}$ cm$^{-2}$.

Then, the n+-type top gate layer removing the above-mentioned photoresist, masking the source and drain regions 6 and 7 with a photoresist, and implanting phosporus ions.

Alternatively, the channel layer 9 and the top gate layer 11 can be formed in the following process.

First, the oxide surface film is selectively removed by using a photoresist layer as a mask, and a photoresists layer is further formed to mask the source and drain regions 6 and 7. By using these photoresist layers as a mask, phosphorus ions are implanted to form the n+-type top gate layer 11.

Then, these photoresist layers are stripped, and a thin thermal oxidation film 12a is formed in the exposed area of the semiconductor surface. A photoresist is coated on the surface of the oxidation film 12a, and the portion for forming the channel layer 9 is removed leaving a photoresist mask. Finally, the p-type channel layer 9 is formed by implanting boron ions through the oxidation film 12a and the top gate layer 11 by the aid of the photoresist mask.

The semiconductor device of this embodiment is operated as follows.

When a voltage difference is applied between the source region 6 and the drain region 7 by grounding the source region 6 and connecting the drain region 7 to a negative terminal of the power supply, and a positive control voltage is applied to the gate region 8, then a drain current between the source and drain is obtained in accordance with the gate control voltage.

In this case, the drain current of the semiconductor device of this embodiment flows uniformly in the channel layer 9 so that the drain current is substantially proportional to the channel width, because the channel layer 9 is formed only in the rectangular area bounded between the source and drain regions 6 and 7, and the channel width is smaller than the length of the source and drain regions 6 and 7.

Therefore, it is possible to determine the drain current at an early step of mask pattern design and layout by setting a ratio (W/L) of the channel width (W) to the channel length (L) in the mask, and to obtain the drain current proportional to the ratio (W/L).

The channel layer 9 of this embodiment adjoins, on both sides, the n-type epitaxial layer 3 of a low impurity concentration whereas both sides of the channel layer of the conventional device shown in FIGS. 4 and 5 are in contact with the highly doped n+-type gate region 8. Therefore, in the semiconductor device of this embodiment, the depletion region extends from each side of the channel layer 9 only to a small extent, so that the channel width is hardly affected, and therefore almost no influence is exerted on a pinch-off characteristic.

Figure 3:
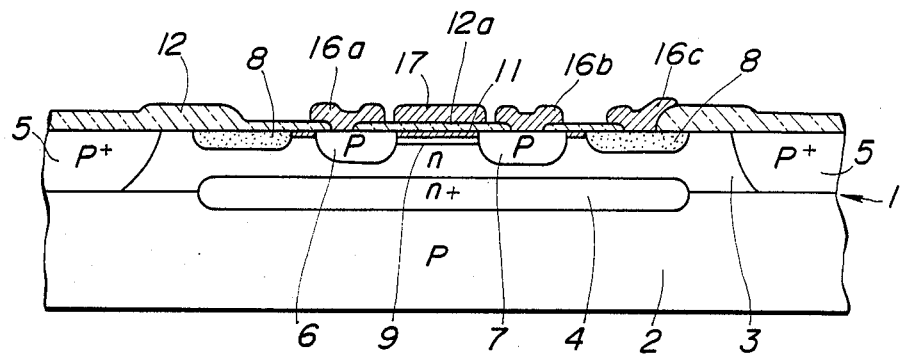
FIG. 3 is a sectional view similar to FIG. 2, but showing a second embodiment of the present invention.

A second embodiment of the present invention is shown in FIG. 3. A junction field effect semiconductor device of FIG. 3 is different from the device of the first embodiment only in formation of an Al electrode 17. The Al electrode 17 is formed on the thin oxide film 12a on the channel layer 9. The electrode 17 serves to prevent the surface potential of the surface of the semiconductor substrate 1, that is, the surface of the top gate layer 11 from exerting influences on the characteristics of the semiconductor device. For example, the electrode 17 is connected to the gate region 8, and held at the same potential.

What is claimed is:

1. A junction field effect semiconductor device comprising:
   a semiconductor substrate,
   a first semiconductor layer of a first conductivity type, formed on said substrate,
   source and drain semiconductor regions of a second conductivity type opposite to said first conductivity type, formed in said first semiconductor layer, said source and drain regions being separated from each other, each of said source and drain regions extending from a first end to a second end,
   a channel semiconductor layer of said second conductivity type, formed only in an area bounded by a quadrangle having two opposite sides one of which joins said first and second ends of said source region, and the other of which joins said first and second ends of said drain region,
   a highly doped gate semiconductor region of said first conductivity type, surrounding said source region, said drain region and said channel layer; said gate region being separated from said channel layer by said first layer, and having an impurity concentration higher than that of said first layer,
   a highly doped gate semiconductor layer of said first conductivity type, formed on said channel layer, said gate layer covering substantially an entire upper surface of said channel layer and extending beyond said channel layer and reaching said gate region, and
   an oxide layer formed on said gate layer above said channel layer, and a metal electrode formed on said oxide layer and separated from said gate layer and said channel layer by said oxide layer.

2. A semiconductor device as claimed in claim 1 wherein each of said source and drain regions extends from said first end to said second end in parallel to the other so that a rectangle is formed by said first and second ends of said source and drain regions, and said channel layer is formed only within an area bounded by said rectangle.

3. A semiconductor device as claimed in claim 2 wherein said first conductivity type is an n-type, and said second conductivity type is a p-type.

4. A semiconductor device as claimed in claim 3 wherein a width of said channel layer is smaller than a length between said first and second ends of said source and drain regions.

5. A semiconductor device as claimed in claim 4 wherein said channel layer has a source end in contact with said source region, a drain end in contact with said drain region, and first and second sides joining said source and drain ends of said channel layer, said first and second sides being separated from said gate region and in contact with said first semiconductor layer.

6. A semiconductor device as claimed in claim 5 wherein said source and drain regions and said channel layer are surrounded by a peripheral area in which said gate layer is formed directly on said first semiconductor layer.

7. A junction field effect semiconductor device comprising:
   a semiconductor substrate,
   a first semiconductor layer of a first conductivity type, formed on said substrate,
   source and drain semiconductor regions of a second conductivity type opposite to said first conductivity type, formed in said first semiconductor layer, said source and drain regions being separated from each other, each of said source and drain regions extending from a first end to a second end,
   a channel semiconductor layer of said second conductivity type, formed only in an area bounded by a quadrangle having two opposite sides one of which joins said first and second ends of said source region, and the other of which joins said first and second ends of said drain region,
   a highly doped gate semiconductor region of said first conductivity type, surrounding said source region, said drain region and said channel layer, said gate region being separated from said channel layer by said first layer, and having an impurity concentration higher than that of said first layer,
   a highly doped gate semiconductor layer of said first conductivity type, formed on said channel layer, said gate layer covering substantially an entire upper surface of said channel layer and extending beyond said channel layer and reaching said gate region,
   an oxide layer formed on said gate layer above said channel layer, and a metal electrode formed on said oxide layer and separated from said gate layer and said channel layer by said oxide layer, and
   said electrode is electrically connected to said gate region so as to make a potential of said electrode equal to a potential of said gate region.

8. A semiconductor device according to claim 1 wherein each of said channel layers and said highly doped gate layer are layers formed by ion implantation.

* * * * *